United States Patent
Duclos et al.

(10) Patent No.: US 6,635,363 B1
(45) Date of Patent: Oct. 21, 2003

(54) PHOSPHOR COATING WITH SELF-ADJUSTING DISTANCE FROM LED CHIP

(75) Inventors: Steven Jude Duclos, Clifton Park, NY (US); Jon Jansma, Pepper Pike, OH (US); Jacob C. Bortscheller, Clifton Park, NY (US); Robert J. Wojnarowski, Ballston Lake, NY (US)

(73) Assignee: General Electric Company, Schenectady, NY (US)

( * ) Notice: Subject to any disclaimer, the term of this patent is extended or adjusted under 35 U.S.C. 154(b) by 318 days.

(21) Appl. No.: 09/642,901

(22) Filed: Aug. 21, 2000

(51) Int. Cl.[7] .................. H01L 33/00; H05B 33/00
(52) U.S. Cl. ............ 428/690; 428/917; 428/161; 313/512; 313/112; 257/95; 257/98; 257/100
(58) Field of Search ................. 428/690, 917, 428/161; 313/512, 112; 257/95, 98, 99, 100

(56) References Cited

U.S. PATENT DOCUMENTS

| | | | |
|---|---|---|---|
| 3,573,788 A | * 4/1971 | Molnar et al. | |
| 3,657,588 A | 4/1972 | McRae | |
| 4,074,163 A | 2/1978 | van der Leeuw | |
| 4,651,048 A | 3/1987 | Liebe | |
| 5,089,750 A | * 2/1992 | Hatada et al. | |
| 5,612,585 A | 3/1997 | Verschueren | |
| 5,680,000 A | 10/1997 | Zuk et al. | |
| 5,757,013 A | 5/1998 | Groger et al. | |
| 5,787,104 A | 7/1998 | Kamiyama et al. | |
| 5,895,225 A | 4/1999 | Kidoguchi et al. | |
| 5,959,316 A | * 9/1999 | Lowery | 257/98 |
| 5,962,971 A | * 10/1999 | Chen | 313/512 |
| 6,066,861 A | 5/2000 | Höhn et al. | |
| 6,069,444 A | 5/2000 | Krafcik et al. | |
| 6,069,867 A | 5/2000 | Ikegame | |
| 6,084,250 A | * 7/2000 | Jüstel et al. | 257/89 |
| 6,252,254 B1 | * 6/2001 | Soules et al. | 257/89 |
| 6,294,800 B1 | * 9/2001 | Duggal et al. | 257/89 |

FOREIGN PATENT DOCUMENTS

| | | | |
|---|---|---|---|
| WO | WO 98/12757 | * | 3/1998 |
| WO | WO 98/39805 | * | 9/1998 |

* cited by examiner

*Primary Examiner*—Marie Yamnitzky
(74) *Attorney, Agent, or Firm*—Fay, Sharpe, Fagan, Minnich & McKee, LLP

(57) ABSTRACT

A light source (10) includes a light emitting component (32), such as a UV/blue light emitting diode or laser diode. A layer (62, 162, 262, 362) of a phosphor material is spaced from the light emitting component by a layer (60, 160, 260, 360) of a material which is transmissive to the light emitted by the light emitting component. The phosphor material converts a portion of the light emitted by the light emitting component to light of a longer wavelength such as yellow light. In a preferred embodiment, the light transmissive layer valise in thickness over the light emitting component so that the phosphor is spaced further from the diode in regions where the emission is higher. This increases the Surface area of the phosphor in these regions and minimizes the effects of overheating and saturation on the phosphor emission.

17 Claims, 6 Drawing Sheets

PHOSPHOR COATING WITH SELF-ADJUSTING DISTANCE FROM LED CHIP

BACKGROUND OF THE INVENTION

This invention relates to a light emitting device comprising a light emitting diode or laser diode (LED) and an excitable phosphor, which is spaced from the LED chip by a light transmissive medium for a more uniform emission of the light output. The invention finds particular application in combination with a UV/Blue LED and a phosphor or blend of phosphors, for converting LED-generated ultraviolet (UV) and/or blue light into white light for general illumination purposes. It should be appreciated, however, that the invention is also applicable to the conversion of light from other light sources to light of a different wavelength.

The advent of GaN-based epitaxial structures has lead to the development of UV and/or blue ("UV/blue") light emitting devices, including light emitting diodes and lasers (both are generally referred to herein as LEDs). By combination of the light emitting device with one or more phosphors, generation of visible light (e.g., red, blue, or white light) is achieved. The phosphor transforms a portion of the UV and/or blue light into light of longer wavelength, for example, by employing a UV/blue absorbing, yellow emitting phosphor, such as $Y_3Al_5O_{12}$—$Ce^{3+}$ (commonly referred to as YAG-Ce), obtainable from Nichia Chemical Company.

To form white light, the YAG-Ce phosphor converts a portion of the LED blue light into yellow light. This produces a white field with a color rendering index (CRI) of about 77 and a color temperature ranging from about 6000 K to 8000 K. For some applications, conversion of UV/blue light from an LED to visible light using phosphors may be more attractive than the direct application of visible LEDs. Such UV/blue LED phosphor devices, for example, other the opportunity to encompass a wider color range, which is important for display as well as for illumination applications. Other phosphors convert the light to different wavelengths. Thus, the color of the light can be modified by combining two or more phosphors.

LEDs, including the blue and UV emitting types, comprise a generally rectangular chip or die, formed from a semiconductor material, that radiates in a non-uniform fashion. In particular, the intensity of light generated at some regions of the front surface of the attached die (e.g., at the bond pads) is only a small fraction of the light emitted from the translucent sides and the remainder of the front (and from the back, in the case of a flip chip). When the die is coated with a layer of phosphor, the non-uniformity in the radiation emitted by the LED results in non-uniform excitation of the phosphor and causes non-uniformity in the color and/or intensity of the light emitted by the device.

In regions where the intensity of the LED emission is relatively high, the phosphor material may become overheated. Many phosphors are temperature sensitive, in that they suffer a temporary reduction in their emission efficiency when they become hot. The effect is reversed when the phosphor cools. The reduction in phosphor efficiency reduces the overall efficiency of the light source and results in a patchy emission- i.e., one which is not uniform in its angular distribution, and/or which varies in color.

Additionally, in areas of particularly high LED emission, the phosphor material can become saturated, i.e., it ceases to show a linear increase in emission as the LED intensity increases. At a certain level of intensity, all the phosphor molecules are in an excited state and thus further increases in LED intensity cannot be utilized by the phosphor.

Another problem with LED emission is that the die attach materials tend to block light emitted from the sides of tile LED. These materials are used to attach the LED to a cup or other support and to provide thermal transfer away from the die to a heat sink. The typical die attach materials used are silver epoxy or ceramic filled epoxy, which are thermally cured. During the die attach process, there is an inherent wicking of the attach material up the sides of the die. It is difficult to apply a sufficient amount of the die attach material to bond the device in place and provide thermal conduction without some wicking taking place. Particularly in the case of LEDs with sapphire substrates, this causes significant degradation in the light output, since a large proportion of the light output from Such LEDs is through the sides.

The present invention provides a new and improved light source, and method of formation, which overcomes the above-referenced problems and others.

SUMMARY OF THE INVENTION

In an exemplary embodiment of the present invention, a light source is provided. The light source includes a light emitting component which emits light and a layer of a phosphor material positioned to receive light emitted by the light emitting component. The phosphor material converts at least a portion of the light to light of a different wavelength. A layer of a light transmissive material spaces the phosphor material from the light emitting component.

In another exemplary embodiment of the present invention, a light source is provided. The light source includes a light emitting component which emits light of at least a first wavelength. A phosphor-containing material is positioned to receive light emitted by the light emitting component and convert the light of the first wavelength to light of a second wavelength. A layer of a light transmissive material spaces the phosphor material from the light emitting component. The layer of light transmissive material has a thickness which is greater in regions where the intensity of the light emitted by the light emitting component is higher than in regions where the intensity of the light emitted by the light emitting component is lower.

In another exemplary embodiment of the present invention, a method of improving a light source emission is provided. The method includes providing a layer of a curable material on a light emitting component and curing the curable material to form a layer of a light transmissive material. The method further includes forming a layer of a phosphor material on the light transmissive material, the light transmissive material spacing the phosphor material from the light emitting component.

One advantage of the present invention is that light is produced with a relatively uniform color over a wide range of viewing angles.

Another advantage of the present invention is that the intensity of the converted light output is increased due to the optimal spacing of the phosphor from the die.

Another advantage of the present invention is that the phosphor is thermally insulated from high temperatures generated near the LED junction.

Another advantage of the present invention derives from the ability to form the phosphor in an even, thin layer with a greater surface area than that of the die.

Still further advantages of the present invention will become apparent to those of ordinary skill in the art upon reading and understanding the following detailed description of the preferred embodiments.

It will be appreciated that the FIGURES are not shown to scale.

DESCRIPTION OF THE PREFERRED EMBODIMENTS

A phosphor coating is spaced from an LED or other light source by an intermediate light-transmissive layer of self adjusting variable thickness, which is preferably curable by light of a selected wavelength.

Figure 1:
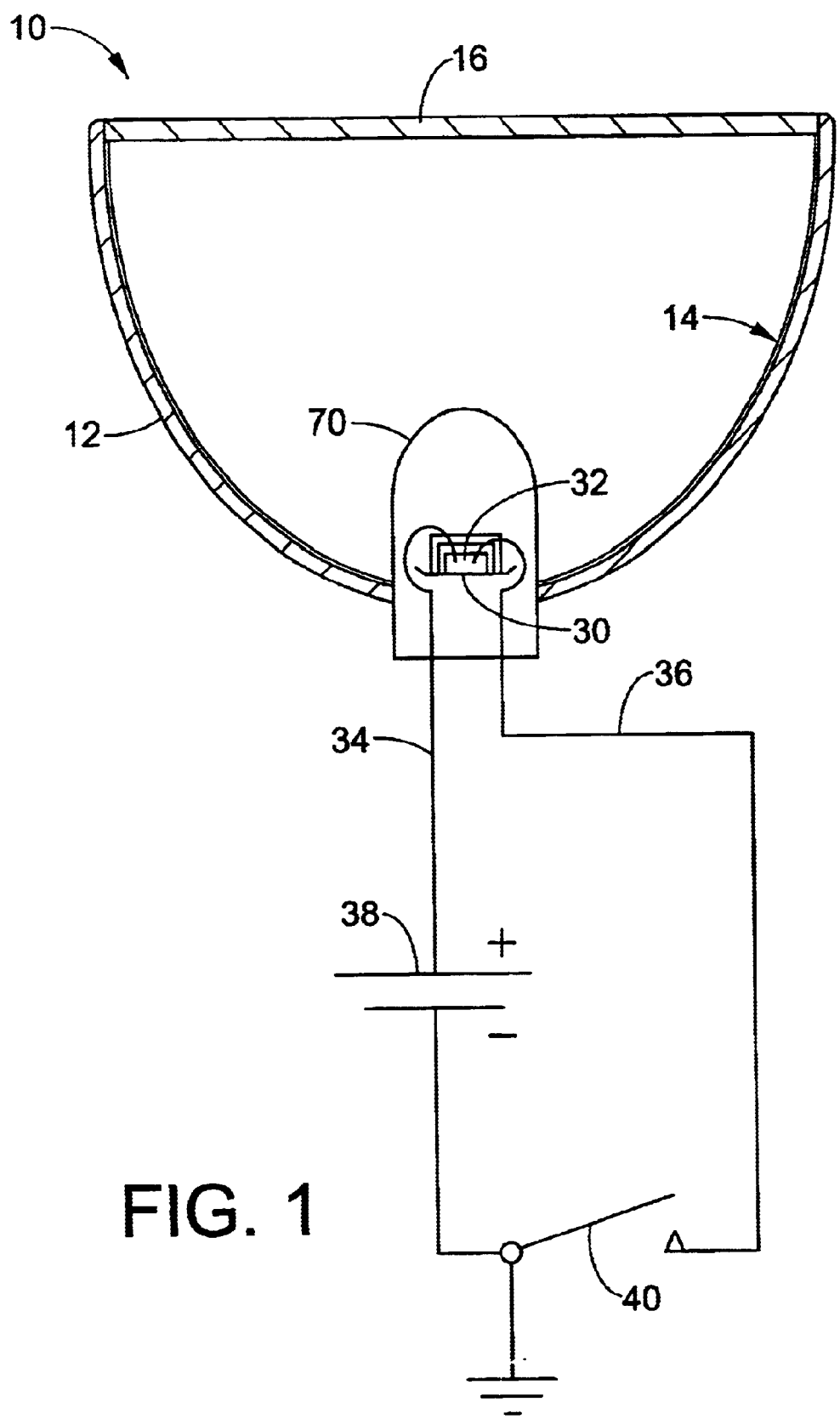
FIG. 1 is a schematic sectional view of a lamp employing a UV-curable intermediate layer and a phosphor layer according to the present invention.

With reference to FIG. 1, a schematic view of a light source, such as a lamp 10, includes a cup-shaped reflector housing 12, which is coated on its interior surface with a reflective coating 14 capable of reflecting light in the UV and/or visible range of the electromagnetic spectrum. As used herein, the term "light" encompasses radiation in the UV and IR regions of the electromagnetic spectrum in addition to light in the visible region of the spectrum-i.e., all radiation emitted by or generated within the light source.

The reflector housing 12 may have a variety of configurations for reflecting light as a beam, or for providing more diffuse light. A light transmissive window 16 covers an open end of the housing. The window may be a lens, for focusing light emitted from the housing, or a sheet of light transmissive material, such as glass, plastic, or the like. Optionally, the window 16 or other portion of the device includes a UV filter which reflects unconverted UV light back into the reflector housing.

A reflective cup 30, capable of reflecting light in the UV and visible range of the electromagnetic spectrum, is positioned at the base of the housing 12. A light-emitting component 32, such as a light emitting diode or laser diode chip (referred to collectively as LEDs), or a bank of LEDs, is received within the cup. Electrical leads 34, 36 connect the light-emitting component 32 to a source of power 38, such as a battery, or other electrical power source. On application of a voltage (e.g., by operating a switch 40), light is emitted by the LED 32 into the housing and may be reflected from the reflective coating 14 and/or the cup 30.

Figure 2:
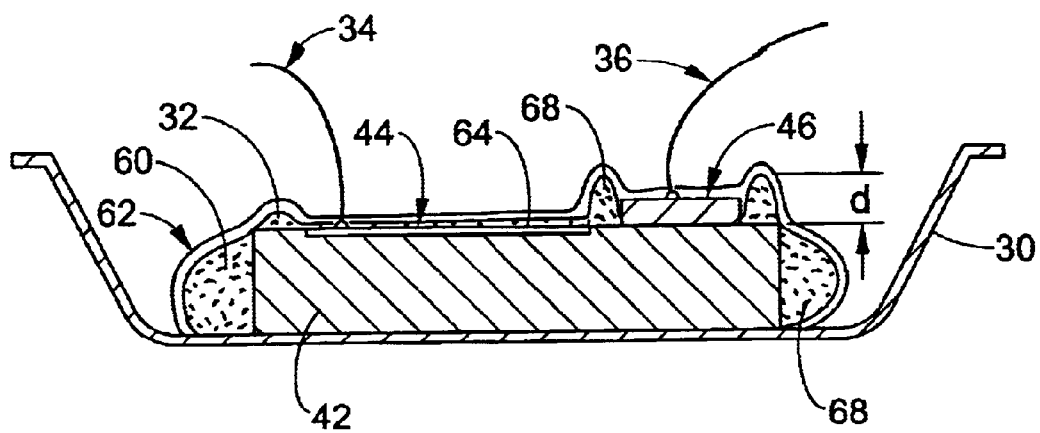
FIG. 2 is an enlarged side view of the LED chip, UV-curable intermediate layer, and phosphor layer of FIG. 1.
Figure 3:
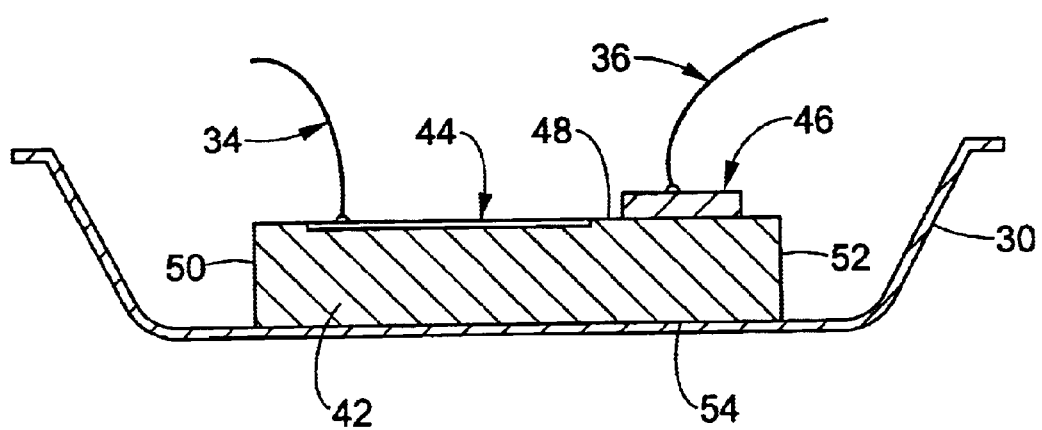
FIG. 3 is an enlarged side view of the LED and electrodes of FIG. 1 prior to formation of the intermediate layer.

With reference now to FIGS. 2 and 3, the light emitting component 32 includes a chip 42 comprising a plurality of layers of semiconductor material. Electrical leads 34, 36 are connected with the chip at bond pads or electrodes 44, 46. The bond pads are preferably light-transmissive, although there is invariably some reduction in the intensity of the emission from the LED chip at the bond pads. In the embodiment of FIG. 2, one of the electrodes 44 is transmissive, while the other electrode 46 is opaque. Although the electrodes are shown as making a connection with a front surface 48 of the chip, each of the electrodes is connected with a different layer of the semiconductor material, and either or both electrodes may be located on the front surface, sides 50, 52, or back surface 54 of the chip.

Figure 4:
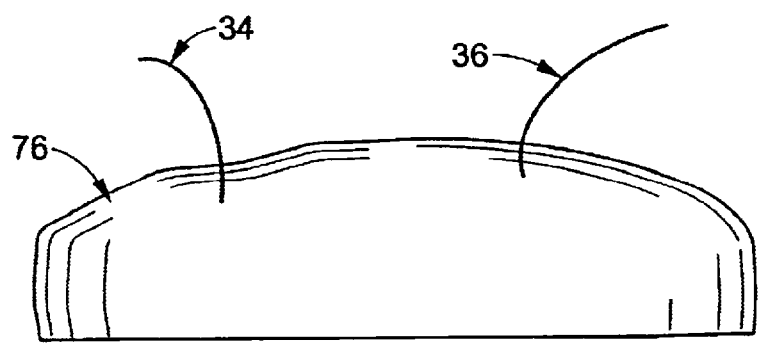
FIG. 4 is side view of the LED and electrodes of FIG. 3 coated with a light curable medium.

A variable thickness layer 60, formed from a light transmissive material (specifically, light in the UV/blue region of the spectrum), surrounds the UV/blue radiating sides of the chip, i.e., the front 48 and sides 50, 52 of the chip. The layer 60 is formed from a light curable medium (such as a UV/blue curable medium). In the embodiment of FIG. 4, the back surface 54 of the chip is attached to an opaque header and is not used for transmission of light, although embodiments in which the base of the chip is also coated with a layer similar to the layer 60 are also contemplated.

A layer 62 of relatively uniform thickness comprising a phosphor material coats at least a front surface 64 of the UV/blue transmissive layer 60 and preferably also the sides of the layer 60, thus covering each of the sides of the layer 60 through which light may be emitted. As shown in FIG. 2, the layer 60 spaces the phosphor layer 62 from the LED by a variable distance d. Where the intensity of light emitted from the die is greater (in the embodiment of FIGS. 2–5, this is adjacent the front surface 48 of the die, in areas 68 away from the electrodes, and adjacent the midpoint of the sides 50, 52), the thickness of the layer 60 is also greater. Where the intensity of the light emitted is low, such as over the transmissive electrode 44, or absent, such as over the opaque electrode 46, the layer 60 is correspondingly thinner, or absent altogether. Specifically, the thickness d of any selected region of the layer 60 varies in relation to (e.g., is proportional to) the intensity of the light passing through that region of the layer. Thus, the distance d varies according to the intensity of the LED emission at the particular position.

The phosphor material in layer 62 converts a portion of the emitted light from the chip 42 to a different wavelength, in the visible region of the spectrum. In the case of a blue/UV LED, the phosphor typically converts the light from the LED to a longer wavelength. While the light source will be described with particular reference to a blue/UV LED, it should be appreciated that LEDs emitting in different regions of the electromagnetic spectrum are also contemplated.

The LED 32 is preferably protected by a resin mold 70 (see FIG. 1), which may be formed from a clear epoxy, or other transparent encapsulation material, which transmits the light emitted from the light emitting, components. Preferred epoxy encapsulation materials include UV/blue light resistant epoxies, such as cycloaliphatic epoxies. As shown in FIG. 1, the resin mold also encapsulates the phosphor-containing layer 62 and the intermediate layer 60. This allows the resin material to act effectively as a lens, if desired, focusing the scattered and converted light.

The variable thickness layer 60 is formed from a material 76 (see FIG. 4) which is curable by radiation, i.e., it is converted from a liquid or viscous fluid to a solid under the application of radiation. In a preferred embodiment, the material 76 is cured by light from the chip 42. If the chip is a UV/blue chip, the wavelength at which the medium is cured is in the blue and/or UV region of the electromagnetic spectrum (i.e., within the wavelength ranges(s) of the radiation emitted by the LED chip). For LEDs which emit a different radiation, such as in the red/IR region of the electromagnetic spectrum, a curable medium which is cured by these wavelengths (and is transmissive thereto when cured) is preferably used. Once cured, the light curable medium in the form of the variable thickness layer 60 is transmissive to light emitted by the LED.

A variety of materials may be used for forming the variable thickness layer 60. For example, UV/blue curable epoxies or polyvinyl alcohol (PVA) may be used. Octacat™, available from General Electric's Silicone Products, Waterford, N.Y., or FC530, available from 3M, are non-limiting, examples of such UV/blue curable materials. Dental adhesives, which are activated by UV/blue light make particularly good crosslinkable materials 76. An example of such an adhesive is a blue-cured dental adhesive sold under the trade name Dentsply's Prime & Bond, by Caulk, Inc.

Optionally, a curable material may be combined with a chromatic salt, which forms a complex with the curable material on exposure to a selected radiation. Examples of chromatic salts for forming UV-sensitive complexes with PVA are discussed in "Water Soluble Gums and Resins," Chapter 20, by R. L. Davidson, McGraw Hill, 1980.

Under irradiation by UV and/or blue light, the curable medium 76 is caused to crosslink, or otherwise form a solid, cured material.

The phosphor material comprising the layer 62 may include a combination of phosphors, such as two or more different phosphors (fluorescent materials). When the phosphor material includes two or more different phosphors, these are preferably mixed together in the coating 62. Alternatively, the different phosphors are layered in the coating.

The phosphor(s) that comprise the phosphor material are substances which are capable of absorbing a part of the light emitted by the LED 32 and emitting light of a wavelength different from that of the absorbed light. Preferably, the phosphors convert a portion of the light to light in the visible region of the spectrum. In a UV/blue LED, the phosphor is used to convert a majority of the UV portion of the light to useful light of longer wavelength in the visible region of the spectrum, and may also convert a portion of the blue light to longer wavelengths. The light output from the lamp is thus a combination of two or more wavelength, namely, unconverted blue light from the LED chip 42 and light of at least one other color, such as yellow light, which has been converted by the phosphor(s). It is also contemplated that the light emitted by one or more phosphors is used to excite another phosphor(s).

The color of the light emitted by the lamp 10 is dependent on the selected mixture of phosphors in the phosphor mixture, on the emission spectrum of the chip 42, on the thickness of the phosphor containing layer, and on the concentration of the phosphor material in the layer. It is generally desirable to achieve white light—e.g., a balance of LED blue light and phosphor emissions. By selection of the type of LED used and the phosphor(s) in the phosphor material, light of a preselected color, such as white light, can be achieved. The visible light passes through the window 16 and/or is focused by the lens.

The spacing between the phosphor layer 62 and the LED chip 42 influences the excitation of the phosphor and the resulting color of the light emitted. For uniform excitation of the phosphor, it is desirable for the phosphor layer to be spaced from the chip by a distance d, which is in relation to the intensity of the LED emission adjacent the phosphor position. The spacing of the phosphor layer from the chip reduces the tendency for overheating of the phosphor layer. Spacing the phosphor layer also provides an increase in the surface area of the phosphor layer, which spreads the LED emission over a greater area, reducing saturation problems and overheating problems. The larger surface area of the phosphor layer allows a thinner phosphor layer to be used, which has benefits in increased intensity of the light source. This is because phosphor materials tend to absorb some of the LED emission and thus it is desirable to have a phosphor which is as thin as possible, yet achieves the desired conversion of light.

Light emitting components 32 suited to use in the present invention include GaN-based (InAlGaN) semiconductor devices. Suitable GaN semiconductor materials for forming the light emitting components are generally represented by the general formula $In_iGa_jAl_kN$, where $0 \leq i$, $0 \leq j$, $0 \leq k$, and $i+j+k=1$. The nitrite semiconductor materials may thus include materials such as InGaN and GaN, and may be doped with various impurities, for example, for improving the intensity or adjusting the color of the light emitted. Laser diodes are similarly formed from an arrangement of GaN layers. Techniques for forming, LEDs and LDs are well known in the art.

GaN-based light emitting devices are capable of emitting light with high luminance. A suitable GaN-based LED device includes a substrate layer formed from a single crystal of, for example, sapphire, silicon carbide, or zinc oxide. A epitaxial buffer layer, of, for example, n GaN is located on the substrate, followed by a sequence of epitaxial layers comprising cladding layers and active layers. Electrical contact is made between two of the layers and the corresponding voltage electrodes 34, 36 (through a metal contact layer) to connect the LED to the circuit and source of power.

The wavelength of the light emitted by an LED is dependent on the material and the configuration of the semiconductor layers employed in forming the LED. As is known in the art, the composition of the semiconductor layers and the dopants employed can be selected so as to produce an LED with an emission spectrum which closely matches the excitation (absorption) spectrum of the phosphor material in layer 62.

While the invention is described with particular reference to UV/blue light emitting components, it should be appreciated that light emitting components which emit light of a different region in the electromagnetic spectrum may also be used.

A variety of phosphors may be used in the present invention to form the phosphor material. In one embodiment, a UV/blue absorbing, yellow emitting phosphor is used in combination with an LED which emits at least a portion of its light in the blue region of the spectrum Exemplary yellow emitting phosphors include cerium activated phosphors of garnet-based fluorophors containing at least one element selected from the group consisting of Y, Lu, Sc, La, Gd, and Sm and at least one element selected from Al, Ga, and In. Examples of this type of phosphor include $Y_3Al_5O_{12}:Ce^{3+}$ (commonly referred to as YAG-Ce). Such phosphors are disclosed in U.S. Pat. No. 5,998,925. The yellow emitting phosphor is used to convert a portion of the light emitted by the LED to light in the yellow portion of the visible spectrum. The blue and yellow light is combined to produce white light.

In the description of phosphors, a conventional notation is used, wherein the chemical formula for a host or matrix compound is given first, followed by a colon and the formula for an activator (an impurity that activates the host crystal to luminesce). For example, in the case of a yellow YAG emitter, $Y_3Al_5O_{12}:Ce_{3+}$, $Y_3Al_5O_{12}$ is the host and $Ce^{3+}$ is the activator.

In the case of LEDs which emit primarily in the UV region of the spectrum, a combination of phosphors, such as a red, a (green, and a blue phosphor can be used to form white light.

Examples of other phosphors which may be utilized in the phosphor material include blue emitters, such as $BaMg_2Al_{16}O_{27}:Eu^{2+}$, or $(Ba, Sr, Ca)_5(PO_4)_3Cl:Eu^{2+}$ which convert a portion of the UV light to blue light, and red emitters, such as $Y_2O_3:Bi^{3+}$, $Eu^{2+}$, which convert a portion of the UV light to red light. Other suitable phosphors include $Y_2O_2S:Eu$ (a red emitter), and $ZnS:Cu, Ag$, (a green emitter).

Where more than one phosphor is used in the phosphor material, the phosphors may be mixed together in a single layer 62, separately layered to form a multi-layer coating, or separated into isolated regions.

To form the phosphor layer 62, the phosphor or phosphors used may be dispersed/blended in a dispersant, such as water, or other solvent. The resulting suspension is applied to the surface of the culred intermediate layer 60 and dried to form the layer. Alternatively, the phosphor layer 62 may be applied by air powder methods, as will be described in further detail herein. Or, the phosphor(s) may be mixed with a suitable solvent and applied to the surface of the layer 60. In yet another embodiment, the phosphor material may be combined in powdered or granular form with a support material in layer 62, analogously to the curable medium 76 or resin material 70 described previously. For example, the phosphor material is mixed homogeneously with a curable medium, such as PVA, silicone, or epoxy. The PVA or epoxy impregnated with the phosphor can be cured with a second LED excitation, for example, at a higher intensity than that used to cure the layer 60. Or, other forms of curing, such as an external source of light or heat may be used, where the curing agent in the phosphor layer is responsive to such curing methods.

Phosphors to be used in a phosphor blend in light source 10 preferably have the following attributes:

1. Light stability. Ideally, the phosphor is one which has a good light stability so that its fluorescent properties are not degraded when used over an extended period of time.
2. Capability of emitting light with a high efficiency.
3. Temperature stability, if located in the vicinity of the LED.
4. Weatherability in the operating environment of the light source.

The product of phosphor grain density and grain size is preferably high enough to ensure that most of the UV light is converted to visible light.

To form the light source, the leads 34 and 36 are connected with bond pads 44, 46 on the LED chip 42 (FIG. 3). The chip is positioned in the cup 30 and the cup filled with the curable medium 76 to a thickness greater than that of the desired eventual thickness of the layer 60. (FIG. 4). Then the leads 34, 36 are connected with a source of power to energize the chip 42. The chip emits light of its characteristic wavelength, which begins to cure the light-curable medium. The rate of cure (i.e., the thickness of the cured material after a given time) is dependent on the light emission from the adjacent portion of the chip. The electrodes, and other low transmissive regions of the chip surface, act as masks, slowing, or preventing cure of the adjacent material 76. Thus, the material cures at different rates, depending on the light received.

After a selected period of time, the curing process is stopped, for example, by switching off the LED. The time period and intensity of the LED emission is chosen so as to give a layer 60 of varying thickness. The LED may be run at a higher or lower drive current than is used in normal operation of the lamp to increase or decrease the average thickness of the film for a given exposure time. Changing the LED operating mode may also be used to influence the average thickness, such as by employing a pulse mode. The exposure time and/or intensity of LED emission is less than that which would be required to cure the entire thickness of the material 76.

Figure 5:
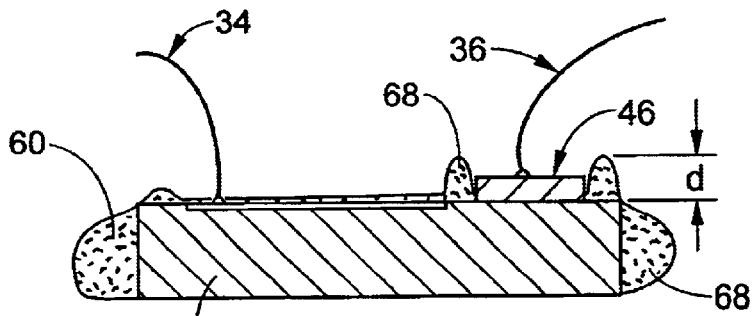
FIG. 5 is side view of the LED and electrodes of FIG. 4 after curing, coated with a variable thickness layer.

The remaining, uncured material 76 is then removed, for example, by rinsing in a suitable solvent, leaving the cured variable thickness layer 60 (FIG. 5). The type of solvent which is used depends oil the nature of the light-curable material. Exemplary solvents include water, organic solvents, such as hydrocarbons, alcohols, ketones, and the like. For blue-cured dental adhesives, acetone is a convenient solvent.

Optionally, the uncured material 76 is laid down in multiple layers, each layer being cured and the uncured material removed, before application of the next layer. The different layers may be cured using different intensities or exposure times of the LED light.

The phosphor layer 62 is then formed. Because the material 76 is cured from the inside, the outer surface of the cured material comprises a layer of partially cured material, even after solvent washing. The partially cured material is sticky and acts as an adhesive for the phosphor material. The phosphor material sticks readily to the surface in a thin, even layer. The phosphor material may thus be conveniently deposited on the sticky material by air powder methods, in which a spray gun is used to spray a fine mist of powdered phosphor on to the surface. The phosphor is thereby embedded in the partially cured material. The LED may then be switched on again, or an outside source of UV or visible light may be used, to completely cure the coating 60. Or a heat final cure may be used if the curing agent in the medium 76 is responsive to both processes.

Where the phosphor layer 62 comprises a curable medium, the phosphor or phosphors used are mixed with the light curable medium to form a curable, phosphor-containing material. The variable thickness layer of FIG. 5 is coated with a layer of this material and the layers 60 and 62 cured completely, either with an outside source, or by using the LED at a higher intensity than for initial curing of the layer 60.

Figure 6:
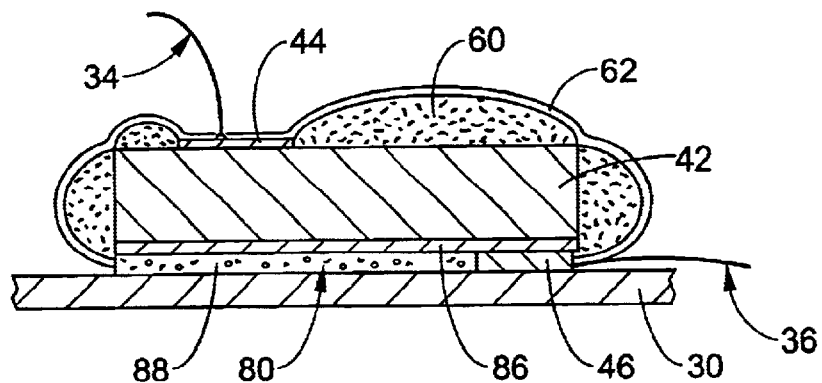
FIG. 6 is a side sectional view of a second alternative embodiment of a light source according to the present invention.
Figure 7:
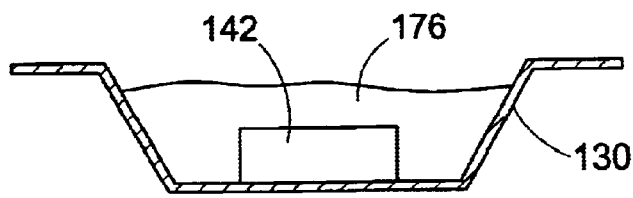
FIG. 7 is an enlarged schematic side view an LED chip and a UV/blue curable medium in an LED cup, according to a third preferred embodiment of the present invention.

With reference now to FIG. 6. in one embodiment the die is bonded to the LED cup 30, or other suitable surface, with a die attach material 80 comprising a UV curable material. Suitable UV curable materials include epoxies and other UV/light curable materials, such as acrylates, silicones, polyurethanes, and those described above. The die attach material 80 provides a physical bond between the cup 30 and a substrate 86 of the die and provides for thermal transfer between the die and a heat sink (not shown). The die attach material can be made to reflect or absorb light by the use of appropriate fillers and dyes in combination with the epoxy or other visible activation materials. For example, fillers may be used to optimize thermal, light scattering, and/or curing properties.

In one preferred embodiment, the filler provides the die attach material with a refractive index which matches that of the sapphire 86 or other substrate of the die and thereby minimizes total internal reflection (TIR). Suitable materials for improving thermal transfer include diamond particulate. Phosphors, such as the YAG-Ce phosphor described above, may be used alone or in combination with other fillers. For example, the die attach material may be combined with one or more phosphors to provide a light activation in the visible region. In such cases, the die attach material is light-transmissive and the cup 30 acts as a reflector to reflect light emitted from the base of the die through the die attach material 80. The die attach material 80 can be cured in the same curing process as layer 60, or cured separately.

In another embodiment for forming the die attach, a polymer mask, such as a thermal epoxy, is applied to the center section of the die and heat cured, leaving a gap at the edges. This provides enough of a die attach 80 to allow wire bonds to be applied to provide the electrical connections. This allows for a bond pad at the underside of the die. Combinations of UV/visible-curing and heat curing may alternatively be used. For example, a UV or visible source may be used to position the die, followed by heat application to completely cure the die attach.

Flip chip embodiments are also contemplated. In these LEDs, the electrical connections are generally made by soldering the electrodes to the chip. The light is sent out of the chip 42 primarily through the back 54 and sides 50, 52.

Optionally, the lamp includes a light scattering material 90. The light scattering material may be mixed with the curable medium 76, mixed with the phosphor, formed as a layer intermediate the phosphor layer 62 and the layer, or positioned elsewhere in the lamp. The light emitted by the LED impinges on the light scattering material 90. The light scattering material 90 scatters at least the blue portion of the light emitted by the LED and generally all of the light emitted by the LED, such that the light exiting the scattering material is distributed in a more uniform angular distribution, i.e., with an emission which is relatively even over a wide range of angles.

The light scattering material 90 may be in the form of fine air bubbles, which are introduced to one or more of the curable layers 60, 62, 70 prior to or during curing of the respective layer.

Or, the light scattering material may be a finely dispersed solid material. The solid light scattering material reflects and/or refracts the light impinging upon it. To scatter light effectively, the light scattering n material preferably has a high index of refraction, preferably greater than about 1.2, and more preferably, greater than about 1.46. The light scattering material is preferably also one which does not appreciably absorb the light.

Scattering efficiency is also influenced by particle size and particle shape. The particle size of the light scattering material is preferably on the order of the wavelength of the light to be scattered. For UV/blue light, a mean particle size of about 0.3 micrometers is thus preferred. Preferably, the mean particle size is less than about ten times the wavelength of light, i.e. for UV/blue light, the mean particle size is preferably less than about 3 micrometers. Preferably, the mean particle size is more than about one tenth the wavelength of light, i.e. for UV/blue light, the mean particle size is preferably more than about 0.03 micrometers. With regard to particle shape, particles with random and angular surfaces are preferred.

Suitable light scattering materials include fine particulate materials, such as glass, quartz, and oxides of Ti, Al, and rare earth elements, such as Gd and Y. Preferred materials are $TiO_2$ and $Al_2O_3$. An exemplary light scattering material is Dupont R960™ $TiO_2$ This material is a fine powder, having a mean particle size of 0.3 micrometers and comprises $TiO_2$ coated with an aluminosilicate glass. This material effectively scatters the wavelengths of light primarily emitted by a UV/blue GaN-based LED without appreciable absorption of the light.

While the light source has been described in terms of a reflector housing 12, other arrangements which do not rely on a reflective surface are also contemplated. In one alternative embodiment, light emitted by the LED device is transported by light pipes.

Figure 8:
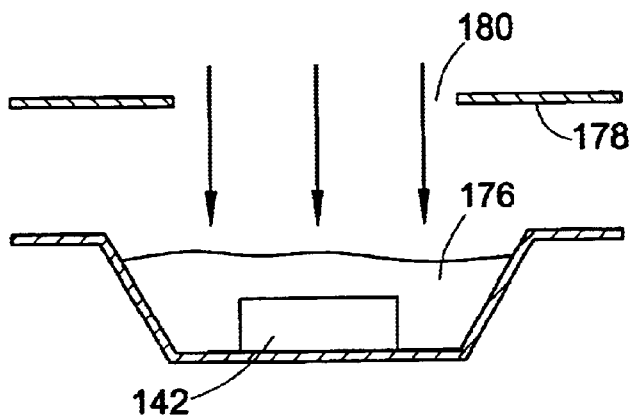
FIG. 8 is a schematic view of the LED chip and cup of FIG. 7 during curing of the UV/blue curable medium.

With reference now to FIGS. 7–11, a second embodiment of a method of spacing a phosphor layer 160 from an LED chip 142 is shown. The die, with electrodes and leads attached (not shown) is positioned in a cup 130 and the cup partly filled with a curable material 176 (FIG. 7), such as a UV/blue curable epoxy or PVA, which is light transmissive when cured. Sufficient material 176 is used so that the top and sides of the chip can be covered to a desired depth with the material, when cured. The curable material is cured by radiation from an external source using a mask 178 to define the width of the material to be cured (FIG. 8). Photolithographic techniques can be used to pattern the areas to which the phosphor material will adhere. In the embodiment of FIG. 8, the mask has an opening 180 slightly wider than the chip 142, so that the front 148 and sides 150, 152 of the chip are coated with cured material. In a preferred embodiment, the curable material is a UV/blue curable PVA and the external source provides a beam of UV/blue light.

Figure 9:
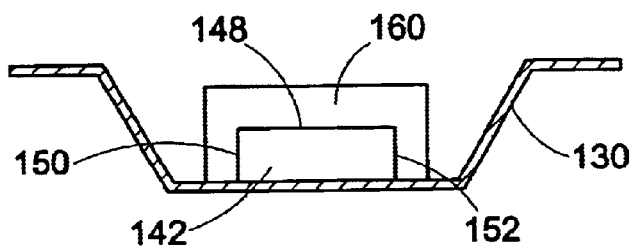
FIG. 9 is a schematic view of the LED chip and cup of FIG. 8 after removal of uncured UV/blue curable medium.
Figure 10:
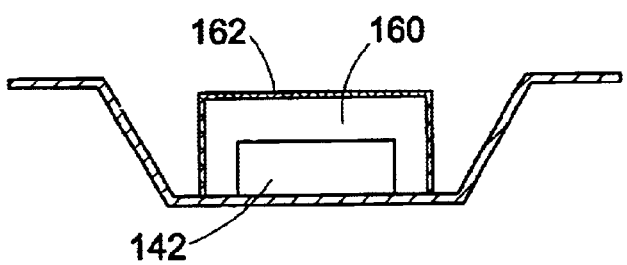
FIG. 10 is schematic view of the LED chip and cup of FIG. 9 after deposition of a phosphor coating on the UV/blue cured medium.
Figure 11:
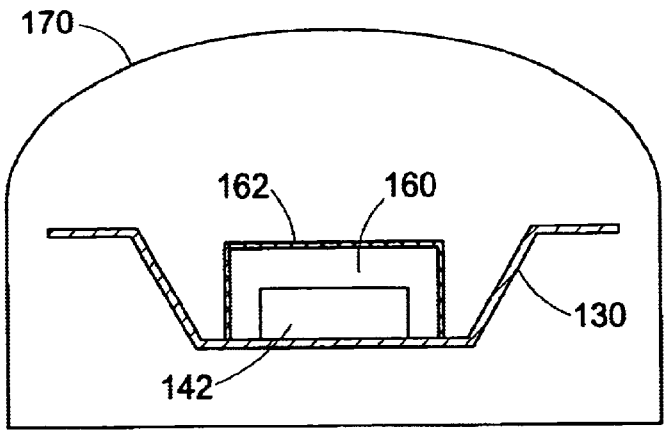
FIG. 11 is schematic view of the LED chip and cup of FIG. 10 after encapsulation in a resin mold.
Figure 12:
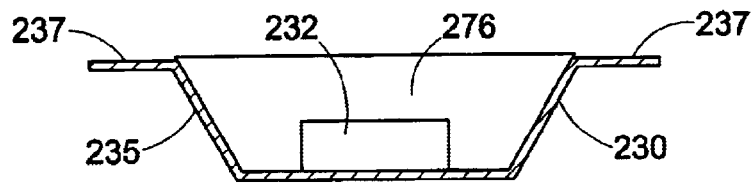
FIG. 12 is an enlarged schematic side view an LED chip and a curable medium in an LED cup, according to a fourth preferred embodiment of the present invention.

Once the desired portion of the material 176 has been cured, the uncured PVA is washed away with a suitable solvent (FIG. 9). The phosphor layer 162 is then formed (FIG. 10). Since the outer layer of the material 176 is not sticky, air powder methods are less favored for applying the phosphor material than for the embodiment of FIGS. 2–5. However, other methods, such as mixing the phosphor material with an evaporable solvent or combining the phosphor with a curable medium are effective for producing a thin phosphior layer The assembly of FIG. 10 is then encapsulated in a resin mold 170, or other suitable packaging material (FIG. 11)

With reference now to FIGS. 12–16, a third embodiment of a method of spacing a phosphor layer 262 from a chip or die 242 is shown. The die, with electrodes and leads attached (not shown) is positioned in a cup 230. The cup has a side wall 235 which defines an outwardly extending annular flange 237 at an upper end thereof The cup is filled to the top with a curable material 276 (FIG. 12), such as a silicone, epoxy, acrylate, polyurethane, or the like, which is light transmissive when set. The material completely covers the front and sides of the chip. The curable material is cured either by radiation (heat or light) from an external source or left to cure under ambient conditions, where appropriate, to form a light transmissive layer 260. The resulting cured material has a planar upper surface which provides a smooth substrate for forming a phosphor layer thereon.

Figure 13:
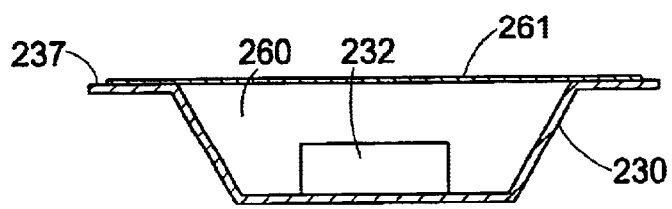
FIG. 13 is a schematic view of the LED chip and cup of FIG. 12 after curing of the curable medium and deposition of a UV/blue curable layer on top of the curable medium.
Figure 14:
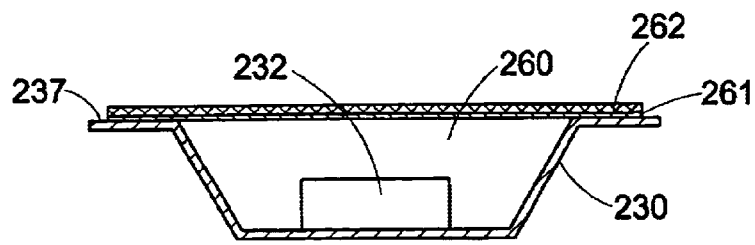
FIG. 14 is a schematic view of the LED chip and cup of FIG. 13 after deposition of a phosphor coating on the UV/blue curable layer.
Figure 15:
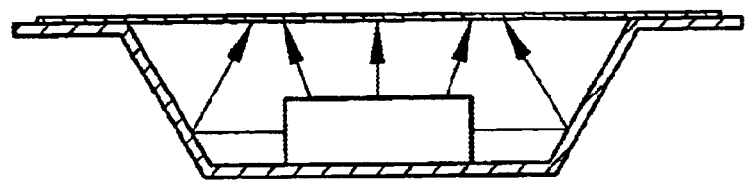
FIG. 15 is schematic view of the LED chip and cup of FIG. 14 during curing of the UV/blue curable layer.
Figure 16:
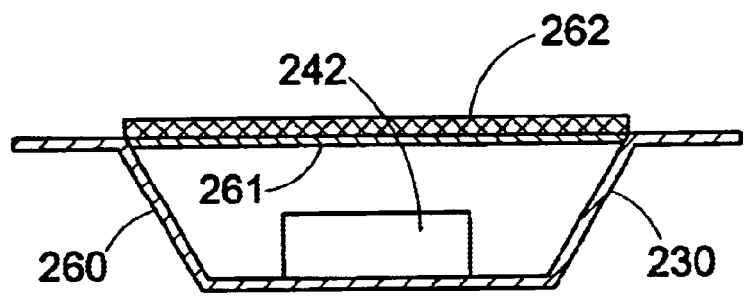
FIG. 16 is schematic view of the LED chip and cup of FIG. 15 after removal of uncured UV/blue curable layer and associated phosphor.

A thin layer 261 of a material which is curable by the LED emission, such as a blue/UV curable PVA or epoxy, is deposited on top of the cured layer 260. (FIG. 13). As shown in FIG. 13, the layer 261 extends beyond the cured layer, on to the flange 237 of the cup, to ensure that all of the light passing out of the cup travels through the layer 261. A phosphor layer 262 is then adhered to the top of the UV/blue curable layer, For example, air powder deposition, as described above, is used to embed the phosphor material into the UV/blue curable layer 261 (FIG. 14). The LED is then activated to cure the UV/blue curable layer and set the phosphor material (FIG. 15). Unwanted UV/blue curable material oil the flange, which has not been cured by the LED emission, can then be removed, for example, by washing the device in a solvent (FIG. 16). The device is then encapsulated as for the embodiment of FIG. 11.

Figure 17:
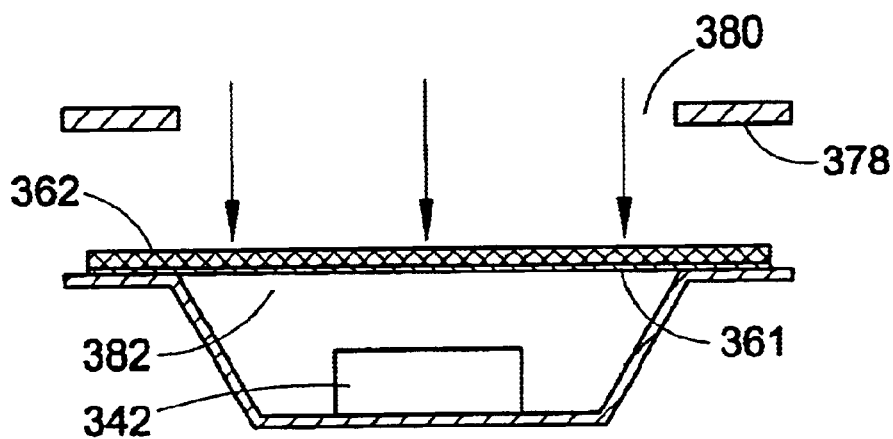
FIG. 17 is an enlarged schematic side view an LED chip, a UV/blue curable medium, and a phosphor layer in an LED cup, during curing of the a UV/blue curable medium, according to a fifth preferred embodiment of the present invention.

In a fourth alternative embodiment, shown in FIG. 17, an outside source with a mask 378, similar to that shown in FIG. 8, is used to cure a curable layer 361, such as a UV/blue curable PVA, having a layer 362 of phosphor deposited on or embedded therein. The process is otherwise similar to the embodiment of FIGS. 12–16. The mask has an opening 380 at least as wide or slightly wider than the cup opening 382 so that phosphor layer covers the cup opening to intercept all light emitted by the chip 342. Once the unmasked portion of the layer 361 has been cured, the uncured PVA is washed away with a suitable solvent leaving the device as shown in FIG. 16.

Each of the embodiments allows a thin phosphor layer 10–100 microns thick to be formed at a spaced distance from an LED chip.

The invention has been described with reference to the preferred embodiment. Obviously, modifications and alterations will occur to others upon reading and understanding the preceding, detailed description. It is intended that the invention be construed as including all such modifications and alterations insofar as they come within the scope of the appended claims or the equivalents thereof.

What is claimed is:

1. A light source comprising:
 a light emitting component which emits light when a voltage is applied, an intensity of the light varying across the light emitting component at the applied voltage;
 a layer of a phosphor material positioned to receive light emitted by the light emitting component, the phosphor material converting at least a portion of the light to light of a different wavelength; and
 a layer of a light transmissive material which spaces the phosphor material from the light emitting component, the thickness of the layer of light transmissive material varying across the layer of light transmissive material in proportion to the intensity of the light emitted by the light emitting component at the voltage, the thickness of the layer of light transmissive material being greater in regions where the light intensity is hither and smaller in regions where the light intensity is lower.

2. The light source of claim 1, wherein the light emitting component is selected from the group consisting of light emitting diodes and laser diodes.

3. The light source of claim 2, wherein the light emitting component emits light in at least one of the blue region and the UV region of the electromagnetic spectrum.

4. The light source of claim 3, wherein the phosphor includes a yellow-emitting phosphor.

5. A light source comprising:
 a light emitting component which emits light, the light emitting component including:
  a die; and
  a die attach material, the die attach material being formed from a material which is curable by light emitted by the light emitting component;
 a layer of a phosphor material positioned to receive light emitted by the light emitting component, the phosphor material converting at least a portion of the light to light of a different wavelength; and
 a layer of a light transmissive material which spaces the phosphor material from the light emitting component, a thickness of the light transmissive material varying across the layer of light transmissive material in relation to the intensity of light emitted by the light emitting component under a fixed set of operating conditions the thickness of the layer of light transmissive material being greater in regions where the light intensity is higher and smaller in regions where the light intensity is lower.

6. The light source of claim 1, wherein the layer of light transmissive material is formed from a light-curable material.

7. The light source of claim 6, wherein light-curable material is curable by light emitted by the light emitting component.

8. The light source of claim 6, wherein the light emitting component emits light in at least one of the blue region and the UV region of the electromagnetic spectrum and the light-curable material is a blue or UV-curable material.

9. The light source of claim 8, wherein the blue or UV-curable material includes at least one of an epoxy and a polyvinyl alcohol.

10. The light source of claim 1, wherein the layer of light transmissive material includes at least an outer portion, adjacent the phosphor layer, formed from a material which is curable by exposure to at least one of UV and blue light.

11. A light source comprising:
 a light emitting component which emits light of at least a first wavelength, an intensity of the light varying across the light emitting component when a given voltage is applied;
 a layer of a phosphor-containing material positioned to receive light emitted by the light emitting component and convert the light of the first wavelength to light of a second wavelength; and
 a layer of a light transmissive material which spaces the phosphor layer from the light emitting component, the layer of light transmissive material having a thickness which is proportionally greater in regions where the intensity of the light emitted by the light emitting component is higher than in regions where the intensity of the light emitted by the light emitting component is lower.

12. The light source of claim 11, wherein the light emitting component is selected from the group consisting of light emitting diodes and laser diodes.

13. The light source of claim 11, wherein the phosphor layer is formed from a material which includes:

a phosphor; and a light-curable material which is curable by light emitted by the light emitting component.

14. The light source of claim 13, wherein the light emitting component emits light in at least one of the blue region and the UV region of the electromagnetic spectrum and the light-curable material is a blue or UV-curable material.

15. The light source of claim 11, wherein the phosphor includes a yellow-emitting phosphor.

16. The light source of claim 11, wherein the light emitting component includes:

a die; and a die attach material, the die attach material being formed from a material which is curable by light emitted by the light emitting component.

17. A light source formed by a method comprising;

providing a layer of a curable material on a light emitting component;

curing at least a portion of the curable material with the light emitting component to form a layer of a light transmissive material; and forming a layer of a phosphor material over the light transmissive material, the light transmissive material spacing the phosphor material from the light emitting component by a distance which varies across the layer of light transmissive material in proportion to the intensity of light emitted by the light emitting component during curing, the distance being greater in regions where the intensity of the light emitted by the light emitting component is higher than in regions where the intensity of the light emitted by the light emitting component is lower.

\* \* \* \* \*

UNITED STATES PATENT AND TRADEMARK OFFICE
CERTIFICATE OF CORRECTION

PATENT NO. : 6,635,363 B1 Page 1 of 1
DATED : October 21, 2003
INVENTOR(S) : Duclos et al.

It is certified that error appears in the above-identified patent and that said Letters Patent is hereby corrected as shown below:

Column 7,
Line 33, cancel "$Y_3Al_5O_{12}:Ce_{3+},_{Y3}Al_5O_{12}$" and substitute -- $Y_3Al_5O_{12}:Ce^{3+}$, $Y_3Al_5O_{12}$ --

Signed and Sealed this

Twenty-fifth Day of May, 2004

JON W. DUDAS
*Acting Director of the United States Patent and Trademark Office*